United States Patent
Kasuga

(10) Patent No.: US 7,642,662 B2
(45) Date of Patent: Jan. 5, 2010

(54) SEMICONDUCTOR DEVICE AND METHOD OF MANUFACTURING THE SAME

(75) Inventor: Takahiro Kasuga, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 11/951,816

(22) Filed: Dec. 6, 2007

(65) Prior Publication Data

US 2008/0258287 A1  Oct. 23, 2008

(30) Foreign Application Priority Data

Dec. 12, 2006  (JP) ............................ 2006-333998

(51) Int. Cl.
*H01L 23/544* (2006.01)

(52) U.S. Cl. ................ 257/797; 257/686; 257/E21.522

(58) Field of Classification Search ................ 257/686, 257/797, E21.522, E23.179
See application file for complete search history.

(56) References Cited

U.S. PATENT DOCUMENTS

| 6,278,193 | B1 * | 8/2001 | Coico et al. ................. 257/797 |
| 6,570,263 | B1 * | 5/2003 | Wu et al. ..................... 257/797 |
| 7,013,559 | B2 * | 3/2006 | Rumsey et al. ................ 29/840 |

FOREIGN PATENT DOCUMENTS

| JP | 09-321086 | 12/1997 |
| JP | 2005-093839 | 4/2005 |

* cited by examiner

*Primary Examiner*—Roy K Potter
(74) *Attorney, Agent, or Firm*—Rankin, Hill & Clark LLP

(57) ABSTRACT

A semiconductor device includes: solder balls provided on an upper package; and pads provided on a lower package and directly connected to the solder balls, wherein at least one of the pads serves as a fiducial mark. Further, a shape of at least one of the pads is different from that of other pads and an area of at least one of the pads is substantially equal to that of the other pads.

4 Claims, 6 Drawing Sheets

SEMICONDUCTOR DEVICE AND METHOD OF MANUFACTURING THE SAME

This application is based on and claims priority from Japanese Patent Application No. 2006-333998, filed on Dec. 12, 2006, the entire contents of which are hereby incorporated by reference.

BACKGROUND OF THE INVENTION

1. Technical Field

The present disclosure relates to a semiconductor device and a method of manufacturing the same, and more particularly to a semiconductor device formed by directly connecting a solder ball of an upper package to a pad of a lower package and a manufacturing method thereof.

2. Background Art

There is a Package on Package (PoP) technique as one of the important element techniques for downsizing, thinning, etc. in electronic equipment. As a typical example of the PoP technique, a configuration of directly connecting a solder ball of an upper package to a pad of a lower package is given, and a semiconductor device with high density and high performance can be achieved.

In the PoP technique, accuracy of recognition of a package position in the case of mutually bonding packages has an influence on quality of a semiconductor device, so that the accuracy becomes very important. Here, JP-A-9-321086 discloses an example of a manufacturing method of a conventional semiconductor device (see FIG. 6). According to the method, metal wirings 121, 122, ... are formed on a mounting substrate 111, and an insulating layer 113 where an opening 114 intersecting with each of the metal wirings 121, 122, ... is formed is formed. Together with the metal wirings 121, 122, ..., a first square alignment mark 116 is formed and also an opening for partially overlapping with this alignment mark 116 is formed in the insulating layer 113 to form a second alignment mark 117. Pads 151, 152, ... are formed at intersections of the opening 114 with each of the metal wirings 121, 122, ... to form a bump electrode, and a displacement of the pads 151, 152, ... can be recognized by recognition of a displacement of the identified corners (corner A, corner B) of the alignment marks 116 and 117.

Further, JP-A-2005-93839 discloses as another example of a manufacturing method of the conventional semiconductor device (see FIG. 7). According to the method, a circuit element having an electrode on one principal surface and a substrate 201 having an electrode 203 for a recognition bump 213 and an electrode 202 for a connection bump 212 disposed on one principal surface are prepared, and the connection bump 212 and the recognition bump 213 are respectively formed in the electrode 202 and the electrode 203 using a wire bonding method. Based on an image of the recognition bump 213 photographed using optical means, a position of the recognition bump 213 is detected and, based on the position, the circuit element is bonded on the substrate 201 through the connection bump 212. Since the top of the recognition bump 213 has a protrusion shape, it is easy to obtain contrast to the electrode 203 and thus a position of the recognition bump 213 can be detected accurately. (See e.g., JP-A-9-321086 and JP-A-2005-93839)

Nowadays, downsizing and thinning in electronic equipment are more advancing and a demand for downsizing and density growth in a semiconductor device is more increasing. However, in the PoP technique for downsizing the semiconductor device, for example, like the conventional semiconductor device shown in FIG. 7, the configuration where the recognition bump etc. for recognizing a package position in a manufacturing process hinders downsizing of the semiconductor device.

SUMMARY OF THE INVENTION

The present invention has been achieved in view of the above, and an object of the present invention is to provide, in particular, small semiconductor device and a manufacturing method thereof and also effectively solve problems such as variations in strength of a bonding part, occurring in the fabrication process.

The present invention solves the above-described problems by the following solution means.

According to a first aspect of the present invention, a semiconductor device comprises:

solder balls provided on an upper package; and pads provided on a lower package and directly connected to the solder balls, wherein at least one of the pads serves as a fiducial mark (recognition mark).

According to a second aspect of the present invention, a shape of at least one of the pads may be different from that of other pads and an area of at least one of the pads may be substantially equal to that of the other pads.

According to a third aspect of the present invention, at least one of the pads may be provided in two places in diagonal positions on the lower package.

According to a fourth aspect of the present invention, at least one of the pads may be provided in three places in positions forming a triangle on the lower package.

According to a fifth aspect of the present invention, a method of manufacturing a semiconductor device comprises:

a) recognizing a position of a lower package placed in a carrier using at least one of pads provided on the lower package and serving as a fiducial mark;

b) performing an alignment between solder balls provided on an upper package and the pads provided on the lower package based on the recognized position; and c) directly connecting the pads and the solder balls to form the semiconductor device.

According to the first aspect of the present invention, one pad for serving as a fiducial mark (hereinafter called fiducial mark pad) has effects of functioning as a pad and also functioning as a fiducial mark. Therefore, it becomes unnecessary to separately provide a region for forming a dedicated fiducial mark in the inner periphery or the outer periphery of a pad region as shown in the conventional semiconductor device, so that a substrate and a lower package can be downsized.

According to the second aspect of the present invention, a fiducial mark pad is formed in a shape different from other pads, so that a position of the fiducial mark pad can be recognized while distinguishing the fiducial mark pad from the other pads by a recognition device. Further, the fiducial mark pad and the other pads are formed such that an area of the fiducial mark pad is substantially equal to an area of the other pads, so that the areas, where solder in the fiducial mark pad and the other pads wetly spreads in bonding an upper package to a lower package, can be substantially equalized, and bonding strength and a formation shape of the solder is not adversely affected and a uniform bonding without variations can be achieved.

According to the third and fourth aspects of the present invention, accuracy of position recognition of a lower package can be improved by a configuration in which fiducial mark pads are provided in plural places, for example, in two places in diagonal positions or in three places in positions forming a triangle.

According to the fifth aspect of the present invention, a step for forming a dedicated fiducial mark can be omitted, and a work period and material cost necessary for the formation can be reduced. Also, a substrate and a lower package can be formed smaller than those of the conventional art and the number of packages capable of being placed in a carrier can be increased, so that production efficiency of a semiconductor device can be improved.

DETAILED DESCRIPTION OF EXEMPLARY EMBODIMENTS

Figure 1:
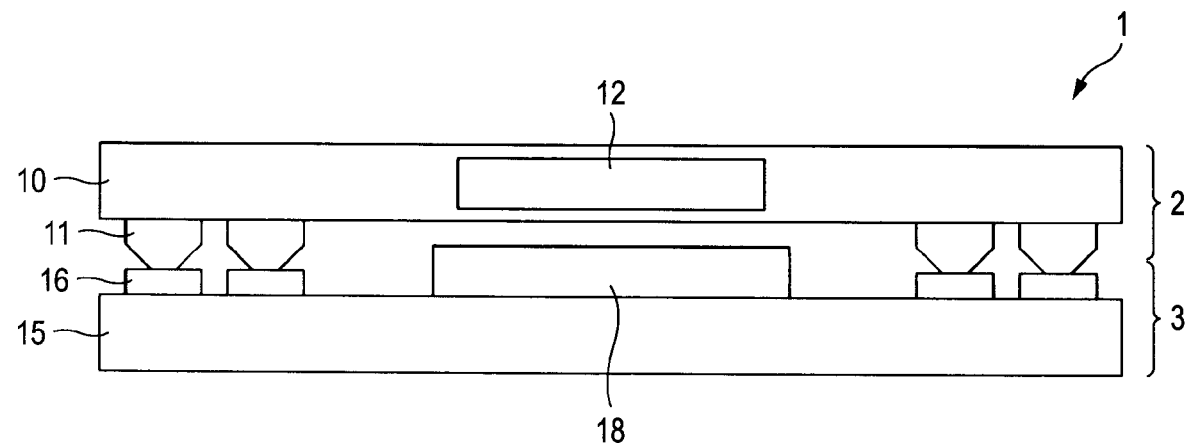
FIG. 1 is a sectional view showing one example of a semiconductor device according to an embodiment of the present invention.
Figure 2:
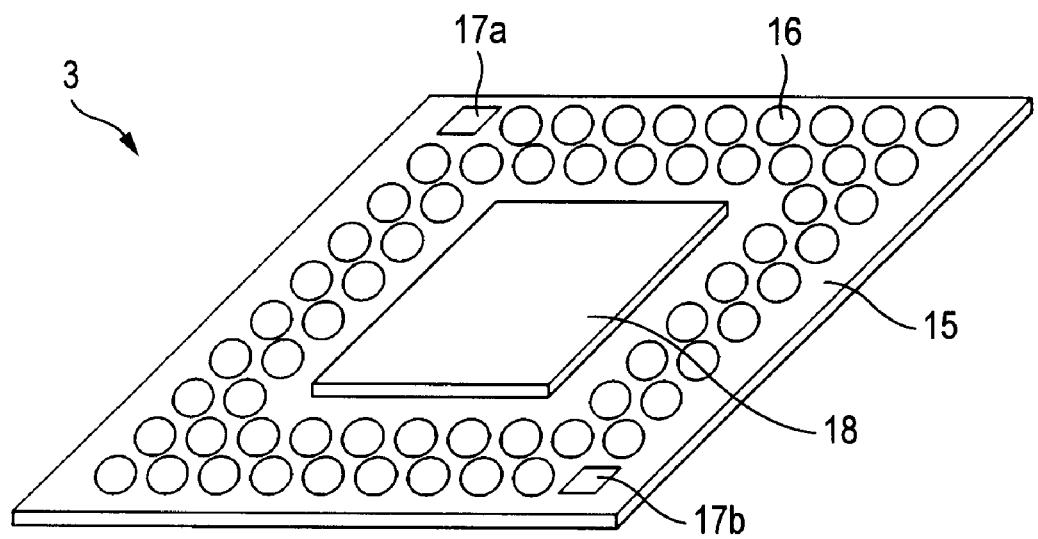
FIG. 2 is a schematic view showing a configuration of a lower package of the semiconductor device shown in FIG. 1.
Figure 3:
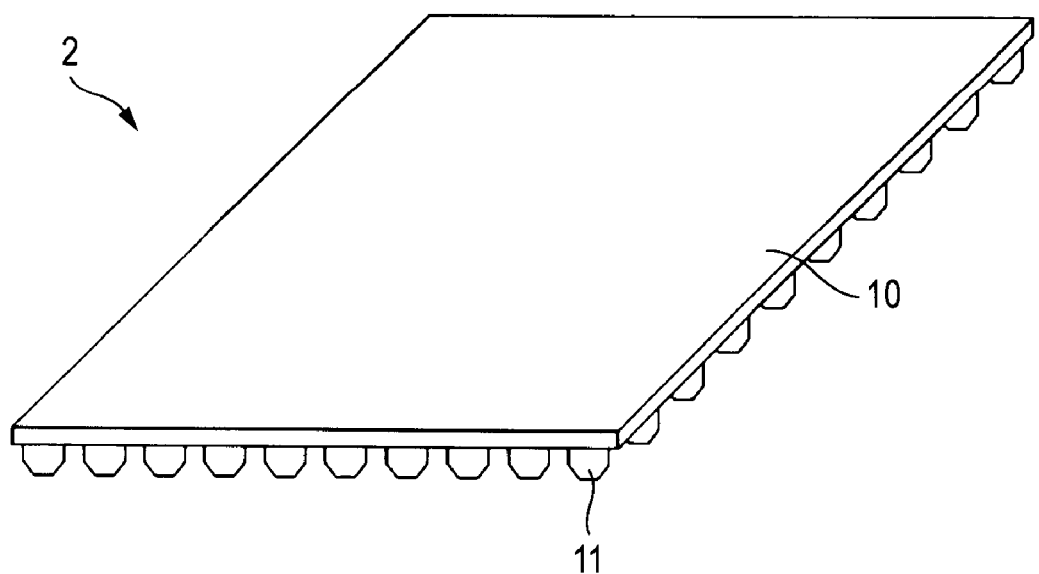
FIG. 3 is a schematic view showing a configuration of an upper package of the semiconductor device shown in FIG. 1.
Figure 4A:
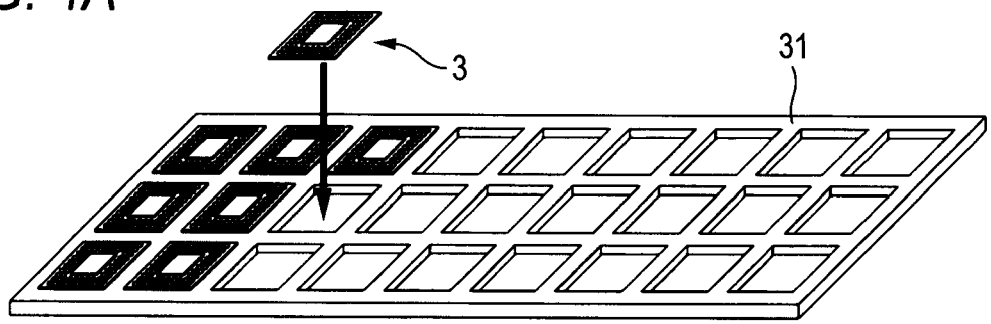
FIGS. 4A to 4C are schematic views describing a manufacturing method of the semiconductor device according to the embodiment of the present invention.
Figure 4B:
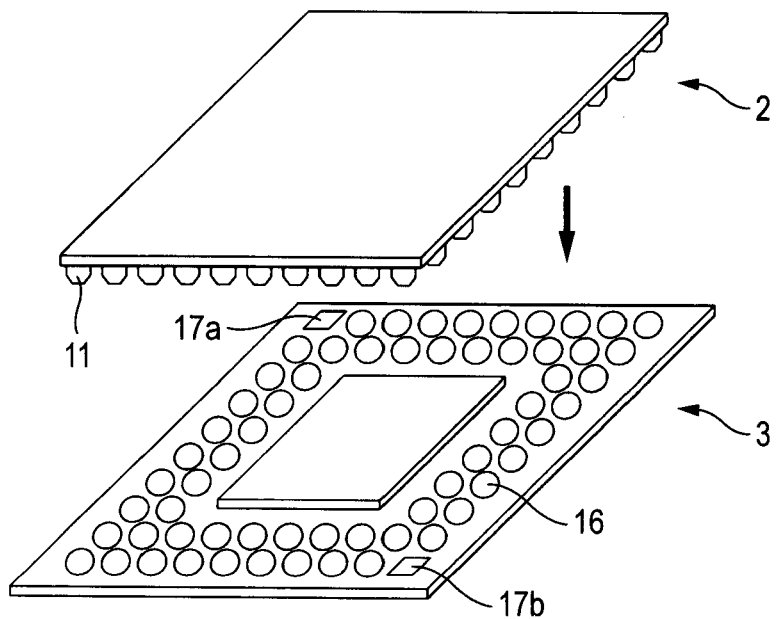
Figure 4C:
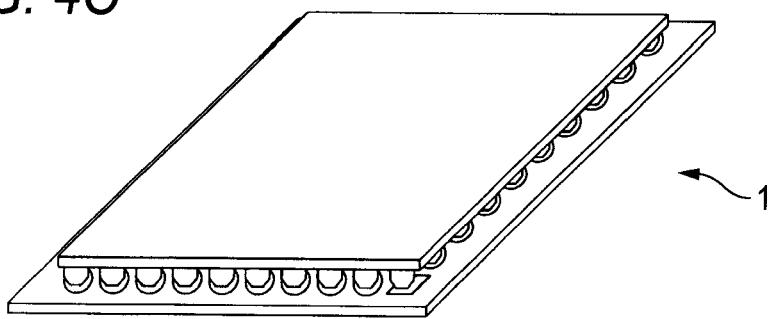
Figure 5:
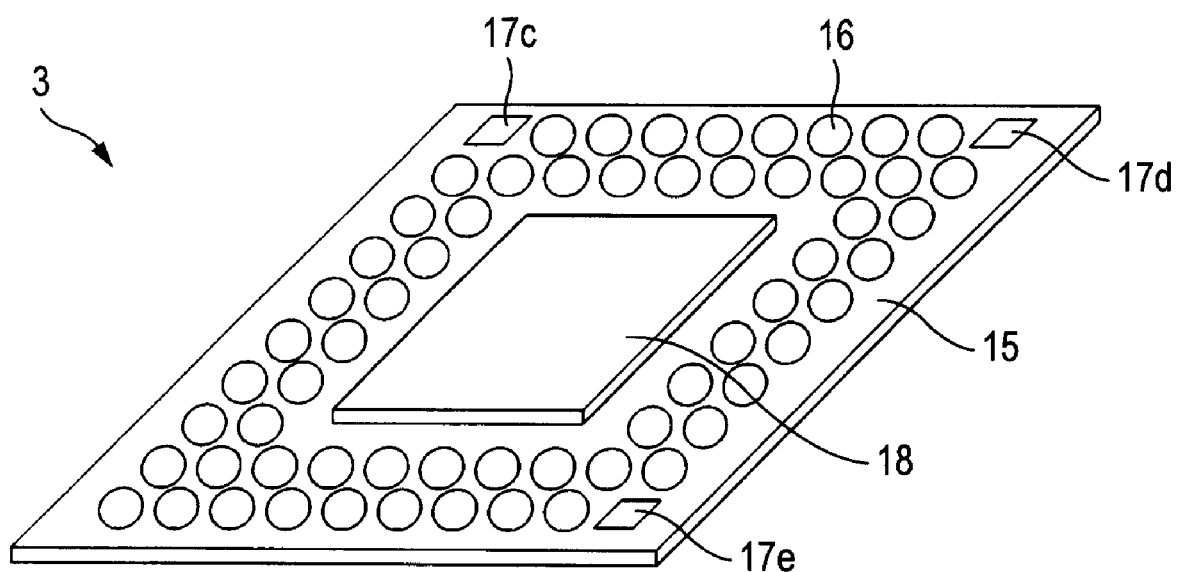
FIG. 5 is a schematic view showing a configuration of a lower package of a semiconductor device according to a second embodiment of the present invention.
Figure 6:
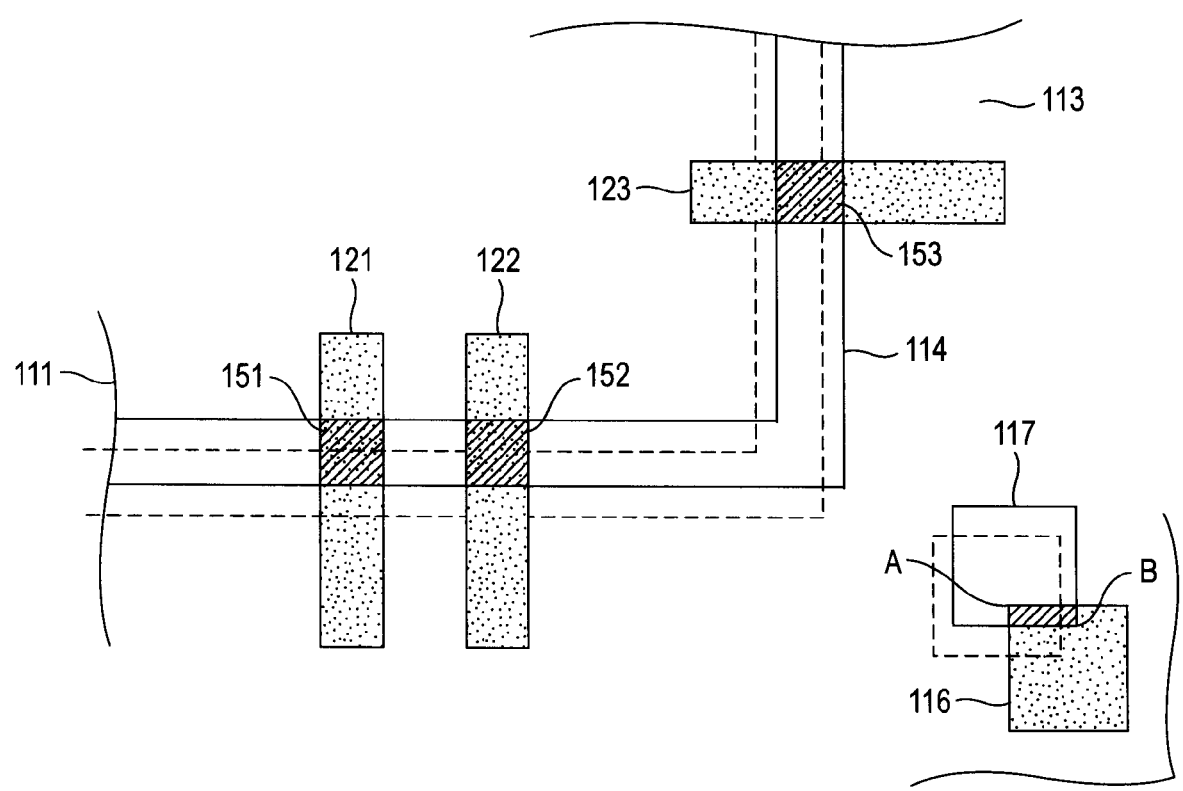
FIG. 6 is a schematic view showing one example of a semiconductor device according to a conventional embodiment.

Embodiments of the invention will hereinafter be described in detail with reference to the drawings. FIG. 1 is a sectional view showing one example of a semiconductor device 1 according to an embodiment of the invention. Also, FIG. 2 is a schematic view showing a configuration of a lower package 3 of the semiconductor device 1. FIG. 3 is a schematic view showing a configuration of an upper package 2 of the semiconductor device 1. FIGS. 4A to 4C are schematic views describing a manufacturing method of the semiconductor device according to the embodiment of the invention. FIG. 5 is a schematic view showing a configuration of a lower package 3 of a semiconductor device 1 according to a second embodiment of the invention. In addition, in numerals of the drawings, numeral 17 is used as a generic term of numerals 17a to 17e.

The semiconductor device 1 as shown in FIG. 1 is configured by directly connecting solder balls 11 of an upper package 2 to pads 16 (and fiducial mark pads 17 as described below) of a lower package 3. This is a configuration designated as the so-called Package on Package (PoP).

In the upper package 2, a semiconductor chip 12 is buried in a substrate 10 and a periphery of the semiconductor chip 12 is covered with resin as one example (FIG. 1). Also, the solder balls 11 electrically connected to the semiconductor chip 12 are provided on a surface opposed to the lower package 3 in the upper package 2.

As shown in FIG. 2 etc., in the lower package 3, a semiconductor chip 18 is flip chip mounted on a substrate 15 as one example. The pads 16 and pads 20 (not shown) are provided on a surface of the lower package 3. The pads 20 are electrically connected to the semiconductor chip 18. Electrical connection between the semiconductor chip 18 and external terminals (solder balls 11 of the upper package 2 in the present embodiment) is performed through the pads 16.

The pad 16 has a circle shape with the diameter of about 0.3 mm as one example. Of course, the pad 16 is not limited to the shape and size. Also, the number of pads 16 provided on the surface of the lower package 3 depends on a kind of a package, and its arrangement is generally formed in parallel two line shape (FIG. 2) or three line shape in the outer periphery of the lower package 3.

For example, as shown in FIG. 2 etc., when normal pads 16 are formed in a circle shape, a part of the pads are formed in a shape other than the circle shape. A pad having the shape other than this circle shape is used as a fiducial mark pad 17. A fiducial mark is provided on the surface of the lower package and is a mark used for recognizing a position of the lower package. The position of the lower package is understood by recognizing the mark. Mounting position coordinates of the upper package are decided in accordance with the position of the lower package. The fiducial mark pad 17 in the embodiment also serves as a terminal in the case of electrically connecting the upper package 2 to the lower package 3 as well as the pad 16 while serving as the fiducial mark. In addition, a shape of the fiducial mark pad 17 may be any shape as long as the shape is not the same as a shape of the pad 16, but it is necessary to differ from the shape of the pad 16 capable of recognizing as the fiducial mark.

In the embodiment, the fiducial mark pad 17 is provided as a quadrangle shape (FIGS. 2 and 5). Of course, the shape may be a triangle, a hexagon, etc. Also, according to arrangement and the number of fiducial mark pads 17, as a first example, it is preferable that the pads 17 are provided in two places in diagonal positions on the lower package 3 like numerals 17a and 17b shown in FIG. 2. In addition, the arrangement is not limited to the diagonal positions and may be any arrangement as long as a position of the lower package 3 can be recognized. Also, as a second example, it is preferable that the pads 17 are provided in three places in positions forming a triangle on the lower package like numerals 17c, 17d and 17e shown in FIG. 5. In addition, the arrangement is not limited to arrangement in the corners and may be any arrangement as long as a position of the lower package 3 can be recognized. In any case, it is not limited to such examples and it is contemplated to form various arrangements by providing a plurality of fiducial mark pads 17.

Also, the fiducial mark pad 17 is formed so that its area becomes substantially equal to the area of the pad 16. Here, "substantially" means that a shape having the physically complete identical area cannot be formed, and also means that an area range (described below) does not affect the strength of bonding to the solder balls 11.

Subsequently, effects according to the above configuration will be described. In the semiconductor device 1 according to the present invention, the fiducial mark pads 17 are provided on the lower package 3. Consequently, one fiducial mark pad 17 has two effects of serving as an electrical connection terminal and a fiducial mark serving as position recognition of the lower package 3 upon connecting the upper package 2 to the lower package 3. Particularly, the fiducial mark pad 17 is formed in a shape different from the pad 16, so that a position of the fiducial mark pad 17 can be recognized while distinguishing the fiducial mark pad 17 from the other pads 16 by a lower package position recognition device (not shown). Further, accuracy of the position recognition of the lower package 3 can be improved in such a manner that the fiducial mark pads 17 are provided in a plurality of (at least two or more) places.

Moreover, according to the semiconductor device 1 of the present invention where the fiducial mark pad 17 is provided, it is not necessary to separately provide a dedicated region for forming a fiducial mark as compared with a configuration in which a fiducial mark pad is provided in the inner periphery or the outer periphery of a pad region as shown in the conventional semiconductor device. Therefore, the substrate 15 and thus the lower package 3 can be downsized. Also, by downsizing the lower package 3, the number of packages (the number of lower packages 3) capable of being placed in a carrier 31 can be increased, so that production efficiency of the semiconductor device 1 can be improved.

However, when the fiducial mark pad 17 is formed from the viewpoint of merely serving as a pad and a fiducial mark, the following bad effect may be caused. Namely, in the case of bonding the upper package 2 to the lower package 3 when the fiducial mark pad 17 differs from the pad 16 in area with a difference in shape, the fiducial mark pad 17 differs from the pad 16 in area in which solder of the solder balls 11 wetly spreads and then variations are caused in bonding strength and a formation shape of the solder after bonding. Thus, one solder bonding part is likely to break. More specifically, as a cause of the variations, when areas of the mutual pads differ from each other and an area of a pad is wider than that of the other pads, solder much wetly spreads on the pad upon reflow and then the solder portion remaining on the original substrate becomes thin (fine). On the other hand, when an area of a pad is narrower than that of the other pad, solder much remains on the original substrate upon reflow and then the solder portion wetly spreading on the pad becomes thin (fine).

The present invention solves the above-described problem by adopting a configuration in which the fiducial mark pad 17 and the other normal pads 16 are formed in such a manner that an area of the pad 17 is substantially equal to that of the pad 16. Namely, by such a configuration, when the fiducial mark pad 17 is used as a pad for electrical connection, the areas where solder wetly spreads can be substantially equalized upon bonding the upper package 2 to the lower package 3 using the fiducial mark pad 17 and the pad 16. Further, bonding strength and a formation shape of the solder is not adversely affected and thus a uniform bonding without variations can be achieved. Therefore, quality of the semiconductor device 1 is stable and percent defective resulting from poor bonding can be reduced.

Namely, based on a technical idea of the semiconductor device 1 according to the present invention, a range of (area difference between the fiducial mark pad 17 and the pad 16) the extent to which bonding strength and a formation shape of the solder is not adversely affected in bonding the upper package 2 to the lower package 3 is defined as a range in which the areas are substantially equal.

Next, a manufacturing method of the semiconductor device 1 according to the present invention will be described with reference to FIGS. 4A to 4C. After the upper package 2 and the lower package 3 including the configuration as described above are prepared and the lower package 3 is placed in the carrier 31 (FIG. 4A), a position of the lower package 3 in the carrier 31 is recognized based on the fiducial mark pads 17 provided on the lower package 3 using a lower package position recognition device (not shown). Based on the position of the lower package 3 recognized therein, the solder balls 11 of the upper package 2 are aligned with the pads 16 and the fiducial mark pads 17 of the lower package 3 and are directly connected to the pads 16, and the pads 17 (FIG. 4B), so that the semiconductor device 1 is formed (FIG. 4C). Then, the fiducial mark pad 17 is formed so that the shape differs from that of the other pad 16 and the area is substantially equal to that of the other pad 16. In addition, as one example, the direct connection is performed by reflowing the solder balls 11. Thereafter, a step of filling an under fill material (not shown) between the upper package 2 and the lower package 3 generally follows.

Subsequently, effects by the manufacturing method will be described.

Figure 7:
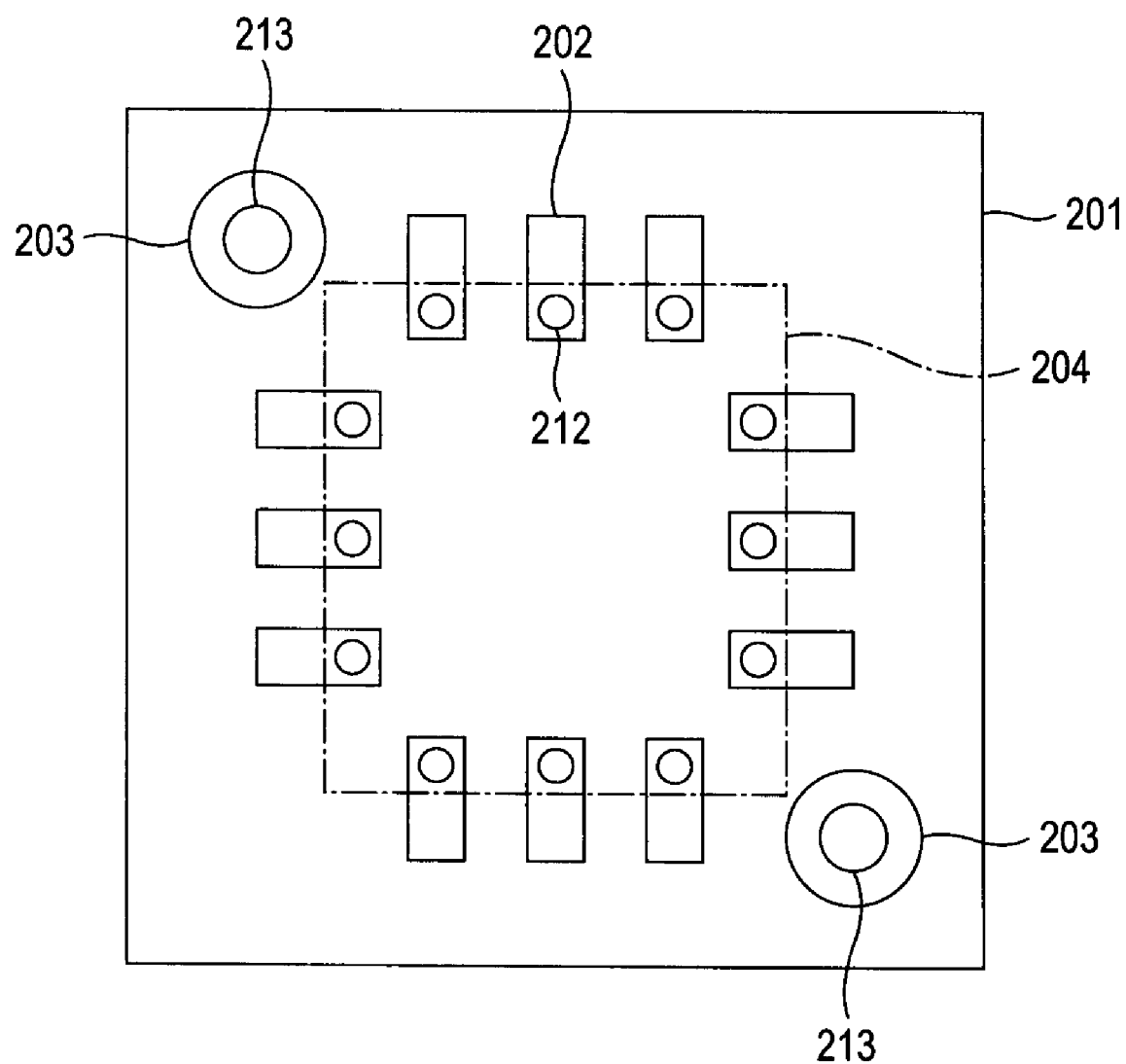
FIG. 7 is a schematic view showing another example of a semiconductor device according to the conventional embodiment.

For example, in the conventional semiconductor device as shown in FIG. 7, the recognition bumps 213 as dedicated fiducial marks are formed on a surface of the substrate 201 constructing the lower package and a position of the lower package (substrate 201) is recognized based on the dedicated fiducial marks (recognition bumps 213). Meanwhile, according to embodiments of the present invention, a position of the lower package 3 can be recognized based on the fiducial mark pads 17 for serving as the pads. Therefore, a step of formation of the dedicated fiducial marks can be omitted, and a work period and material cost necessary for the formation can be reduced.

Further, the substrate 15 and the lower package 3 can be formed smaller than those of the conventional semiconductor device. Therefore, the number of packages (the number of lower packages 3) capable of being placed in the carrier 31 can be increased, so that production efficiency of the semiconductor device 1 can also be improved.

As described above, in accordance with the semiconductor device and the manufacturing method thereof according to the present invention, in the technical field of the semiconductor device where downsizing is particularly important and its demand is remarkable, remarkable downsizing of the semiconductor device formed by a package on package configuration can be achieved, and also a work period and material cost can be reduced and further, the semiconductor device with stable quality is provided and percent defective resulting from poor bonding can be reduced.

In addition, the semiconductor device and the manufacturing method thereof according to the present invention are not limited to the case using a solder bump process, and can also be applied to the case using a pressure welding process.

While there has been described in connection with the exemplary embodiments of the present invention, it will be obvious to those skilled in the art that various changes and modification may be made therein without departing from the present invention. It is aimed, therefore, to cover in the appended claim all such changes and modifications as fall within the true spirit and scope of the present invention.

What is claimed is:

1. A semiconductor device comprising:
    solder balls provided on an upper package; and
    pads provided on a lower package and directly connected to the solder balls,
    wherein at least one of the pads serves as a fiducial mark, and
    wherein a shape of at least one of the pads is different from that of other pads.

2. The semiconductor device of claim 1, wherein an area of at least one of the pads is substantially equal to that of the other pads.

3. The semiconductor device of claim 1, wherein at least one of the pads is provided in two places in diagonal positions on the lower package.

4. The semiconductor device of claim 1, wherein at least one of the pads is provided in three places in positions forming a triangle on the lower package.

* * * * *